United States Patent
Vernickel et al.

(12) 
(10) Patent No.: US 12,085,598 B2
(45) Date of Patent: Sep. 10, 2024

(54) LOCATING AN ERROR IN A SUPPLY OR SIGNAL LINE OF A MAGNETIC RESONANCE SYSTEM

(71) Applicant: KONINKLIJKE PHILIPS N.V., Eindhoven (NL)

(72) Inventors: Peter Vernickel, Hamburg (DE); Oliver Lips, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 123 days.

(21) Appl. No.: 17/606,804

(22) PCT Filed: Apr. 24, 2020

(86) PCT No.: PCT/EP2020/061437
§ 371 (c)(1),
(2) Date: Oct. 27, 2021

(87) PCT Pub. No.: WO2020/221663
PCT Pub. Date: Nov. 5, 2020

(65) Prior Publication Data
US 2022/0206054 A1   Jun. 30, 2022

(30) Foreign Application Priority Data
Apr. 30, 2019 (EP) .................................. 19171745

(51) Int. Cl.
*G01R 31/08* (2020.01)
*G01R 33/36* (2006.01)

(52) U.S. Cl.
CPC .......... *G01R 31/083* (2013.01); *G01R 33/36* (2013.01)

(58) Field of Classification Search
CPC ................. G01R 31/083; G01R 33/36; G01R 31/66–69
See application file for complete search history.

(56) References Cited

U.S. PATENT DOCUMENTS

| 5,551,430 A | 9/1996 | Blakely et al. |
| 6,181,140 B1 | 1/2001 | Vokey et al. |

(Continued)

FOREIGN PATENT DOCUMENTS

| DE | 102013223706 A1 * | 5/2015 | .......... G01R 31/045 |
| EP | 1126283 A1 | 8/2001 | |

(Continued)

OTHER PUBLICATIONS

D. Wirtz et al., Diagnostic MR-Electrophysiology Catheter with Highly Resistive Wires for Reduction of RF-Heating, ISMRM 2008, p. 738.

(Continued)

*Primary Examiner* — Daniel R Miller

(57) ABSTRACT

The invention relates to the field of magnetic resonance, and in particular to determining a location of an error in a supply or signal line (12). Due to the rugged environment for MR systems (10) in hospitals supply or signal lines (12) of MR systems (10) are error prone. For serviceability and part replacement it is important to locate the error in the supply or signal line (12) or to identify the subunit (14, 16, 18, 20) of the supply or signal line (12) in which the error occurred. The basic idea of the invention is to use an additional impedance (24), that is coupled to the supply or signal line (12) of the MR system (10) in the region of interconnection (22) for locating the error in the supply or signal line (12). The additional impedance provides a reference impedance value. By measuring the impedance and comparing the measured impedance to the reference impedance value, the error in the supply or signal line (12) can be located. In one embodiment the additional impedance (24) is realized as additional capacitance and provided as a capacitor (28).

13 Claims, 1 Drawing Sheet

(56) References Cited

U.S. PATENT DOCUMENTS

| | | |
|---|---|---|
| 6,236,217 B1 | 5/2001 | Lewis et al. |
| 2004/0104730 A1 | 6/2004 | Taylor et al. |
| 2009/0189744 A1 | 7/2009 | Wang et al. |
| 2010/0013484 A1 | 1/2010 | Wirtz et al. |
| 2010/0308840 A1 | 12/2010 | Nerreter |
| 2016/0291103 A1 | 10/2016 | Van Leeuwen et al. |
| 2018/0329011 A1 | 11/2018 | Mitsui et al. |

FOREIGN PATENT DOCUMENTS

| | | | | |
|---|---|---|---|---|
| EP | 1167986 A2 | * | 1/2002 | ........... G01R 31/021 |
| EP | 3208621 A1 | | 8/2017 | |
| EP | 3270174 A1 | | 1/2018 | |
| FR | 2997508 A1 | | 5/2014 | |
| JP | H10201028 A | * | 7/1998 | ........... G01R 31/026 |
| JP | 2006014823 A | | 1/2006 | |
| JP | 2009048383 A | * | 3/2009 | ........... G01R 31/045 |
| KR | 20090109373 A | * | 10/2009 | |
| WO | WO-2014097006 A1 | * | 6/2014 | ........... G01R 31/026 |

OTHER PUBLICATIONS

International Search Report and Written Opinion from PCT/EP2020/061437 mailed Nov. 5, 2020.

\* cited by examiner

LOCATING AN ERROR IN A SUPPLY OR SIGNAL LINE OF A MAGNETIC RESONANCE SYSTEM

CROSS REFERENCE TO RELATED APPLICATIONS

This application is a U.S. national phase application of International Application No. PCT/EP2020/061437 filed on Apr. 24, 2020, which claims the benefit of EP Application Serial No. 19171745.3 filed on Apr. 30, 2019 and is incorporated herein by reference.

FIELD OF THE INVENTION

The invention relates to the field of magnetic resonance (MR), and in particular to determining a location of an error in a supply or signal line of a magnetic resonance system.

BACKGROUND OF THE INVENTION

EP 1 126 283 A1 describes a method for locating cable breaks in cables, including fibre optic cables. The conductive shield or armour of the cable is divided into sections, usually at a splice. A step function voltage is applied to one end of the conductive shield. Remote sensors at the end of each section monitor the voltage and current as a function of time and at steady state. The measured data are encoded as current pulses and transmitted along the armour to the end of the cable. A computer at the cable end calculates from the measured voltages and currents the capacitance of each section of the shield. A broken section is identified by comparing the calculated and original capacitances of the sections and the distance along the broken section to the break is calculated from the calculated and original capacitances of the broken section.

SUMMARY OF THE INVENTION

Conventional MR coils are complex devices using electronical devices inside the coil for providing the MR specific functions such as signal amplification, coil detuning, A/D conversion, signal processing, and digital transmission. To support these features one or more power supplies, i.e. supply or signal lines, need to be connected to the coil to supply the desired voltages and/or powers. The supply or signal lines consist typically of several subunits, such as the power supply, the cable to the coil connector (jack) at the patient table, potentially a coil cable with a plug, and the electronical devices inside the coil.

Due to the rugged environment for MR systems in hospitals these supply lines are error prone. If a coil problem occurs, the failing subunit of a respective supply line needs to be located and to be replaced by service personnel. However, there is no reliable method to locate the error if it is in the passive components, namely the cables and connectors involved. Especially for distinguishing errors allocated just before or just after an interconnection of two subunits, which is crucial for part replacement, the methods are not accurate enough. Hence, cumbersome additional tests have to be performed by exchanging one or the other subunit to see if the error persists or not. Similar problems may occur for signal lines which comprise several interconnected subunits.

Therefore, it is an object of the invention to provide a means for locating an error along the supply or signal line for simplified serviceability.

According to the invention, this object is addressed by the subject matter of the independent claims. Preferred embodiments of the invention are described in the sub claims.

Therefore, according to the invention, a magnetic resonance system comprising a supply or signal line is provided, wherein the supply or signal line consists of several interconnected subunits, and wherein in a region of interconnection an additional impedance is coupled to the supply or signal line. Preferably, the supply or signal line is a line for supplying voltages and/or powers to one or more MR coils or a signal line for conveying signals.

Furthermore, the invention also relates to a method for locating an error in such a supply or signal line of a magnetic resonance system, wherein the supply or signal line consists of several interconnected subunits, and wherein in a region of interconnection an additional impedance is coupled to the supply or signal line, and wherein the additional impedance provides a reference impedance value, comprising the steps of a) measuring an impedance, and
b) determining a location of the error by comparing the measured impedance to the reference impedance value.

The basic idea of the invention is to use an additional impedance, that is coupled to the supply or signal line in the region of interconnection for locating the error in the supply or signal line. The term additional impedance indicates that the additional impedance is not needed for the operational capability of the MR system or for the operational capability of the supply or signal line itself. An impedance that is needed for the operational capability of the MR system or for the operational capability of the supply or signal line performs a dedicated function for the operation of the MR system or for the operation of the supply or signal line. Preferably, the dedicated function of the additional impedance is to add a defined value of impedance for locating the error in the supply or signal line. Therefore, the additional impedance provides a defined reference value which may be preset to a desired figure. Preferably, the additional impedance has a defined value that is selected in order to not disturb the power supply function, and/or the MR system function.

The subunits are interconnected to each other along the supply or signal line. The region of interconnection for example comprises the region where two subunits are interconnected to each other and the region where the ends of the supply or signal line are connected to further parts, e.g. parts of the MR system.

The error in the supply or signal line may, for example, be an open circuit fault like a cable break, or it may be a short circuit. The error may of course occur in any of the subunits. The coupling of additional impedance allows determining in which subunit the error occurred. Determining the location of an error may be achieved by measuring the impedance. By measuring the impedance and comparing the measured impedance to the reference value of the additional impedance, it is possible to determine the subunit in which the error is located. Since the additional impedance is coupled to the supply or signal line in the region of the interconnection, it is possible to reliably distinguish between errors allocated in two adjacent subunits.

The supply or signal line of the MR system may be connectable to a power supply or the power supply may be a subunit of the supply or signal line. Furthermore, the supply or signal line can be a power supply line or a signal transmission line or a combination of both. Examples of subunits in the MR system are, for example, a cable, a coil connector, a coil cable with a plug, or the coil electronics or part of the coil electronics. Preferably, the subunits of the supply or signal line are configured in such a way that they are independently replaceable.

A device for measuring the impedance may be incorporated into the MR system. Alternatively, the device for measuring the impedance may be portable and, hence, is not necessarily incorporated into the MR system. A portable device for measuring the impedance can, for example, be used by a technician or by service personnel for locating the error in the supply or signal line. By measuring the impedance, a change of the impedance compared to the reference value of the additional impedance is representative for the location of the error in the supply or signal line. Therefore, no cumbersome additional tests have to be performed by exchanging one or the other subunit to check whether or not the error persists. Hence, it is possible to locate the error reliably by an impedance measurement and the serviceability is highly simplified. The basic idea of using an additional impedance in the region of interconnection for locating an error can be used for devices and/or systems where power has to be reliably transferred via passive components, e.g. cables and connectors.

According to one embodiment of the invention, the subunit comprises a connector and the additional impedance is integrated in the connector. Preferably the connector interconnects the subunits with each other and/or interconnects the supply or signal line with further parts of the MR system. Therefore, the connector is located in the region of interconnection of the supply or signal line. Integrating the additional impedance in the connector is easy to implement. Furthermore, maintenance is simplified, since the connectors are easily accessible.

According to one embodiment of the invention the additional impedance is provided as capacitor, resistor, inductor and/or resonant circuit. The additional impedance can be realized as additional capacitance, additional resistance, additional inductance and/or additional LC combination. Preferably, the additional impedance is realized as additional capacitance and provided as a capacitor. An ideal capacitor has a purely imaginary impedance, therefore only shifting the phase angle of the voltage and current in the applied power. More preferably, especially for supply or signal lines carrying predominantly constant supply current, the capacitor has a capacitance in the order of 100 pF to 1 nF. This value of capacitance allows for not disturbing the function of the supply or signal line of the MR system and makes a reliable location of the error possible. The capacitor may be incorporated in the connector. The realization of the additional impedance as additional LC combination is especially advantageous when combining it with a swept frequency impedance measurement. The location of the error along the supply or signal line can be determined by considering the number of resonance frequencies and the resonance frequency of the LC combination.

According to one embodiment of the invention the additional impedance is connected in parallel to the supply or signal line in the region of interconnection. This indicates that the additional impedance is not connected along a single conductive path of the supply or signal line but connected in parallel, i.e. the addition impedance is connected along multiple paths of the supply or signal line. This is advantageous when the additional impedance is realized as additional capacitance and provided as capacitor or when the additional impedance is realized as additional LC combination and provided as resonant circuit. In this case, it is easily possible to determine the location of an open circuit fault like a cable break, as error in the supply or signal line.

According to one embodiment of the invention the additional impedance is connected in series to the supply or signal line in the region of interconnection. This indicates that the additional impedance is connected along a single conductive path of the supply or signal line. This is advantageous when the additional impedance is realized as additional inductance and provided as inductor. In this case, it is easily possible to determine the location of a short circuit, as error in the supply or signal line.

According to one embodiment of the invention, in each region of interconnection at least one additional impedance is coupled to the supply or signal line. Therefore, the number of additional impedances is preferably in the order of the number of subunits, equal to the number of subunits, or greater than the number of subunits. This is advantageous for locating the error in the supply or signal line. The error in the supply or signal line, of course, can occur in any subunit. In order to distinguish between an error allocated in one subunit and an error allocated in an adjacent subunit and to determine the exact subunit in which the error occurred, it is advantageous to couple at least one additional impedance to the supply or signal line in each region of interconnection. Preferably at least one additional impedance, more preferably two additional impedances are coupled to the supply or signal line in every subunit.

According to an embodiment of the invention, the magnetic resonance system comprises a power supply and an impedance measurement device, wherein the impedance measurement device is integrated in the power supply. For reasons of simplified serviceability it is advantageous to incorporate the impedance measurement device in the power supply of the MR system. By connecting the supply or signal line to the power supply the impedance can be measured using the impedance measurement device. Therefore, it is possible to locate the error in the supply or signal line. Hence, there is no need for the service personnel to bring along a portable impedance measurement device. Therefore, the integration of the impedance measurement device eliminates the risk of forgetting a portable impedance measurement device.

According to one embodiment of the invention, the additional impedance is provided as a highly resistive sensing wire coupled to the supply or signal line in the region of interconnection or as a network of highly resistive sensing wires coupled to the supply or signal line in the region of interconnection. In other words, the additional impedance may be realized as additional resistance. Preferably, the highly resistive sensing wire has a resistance of at least 1 kΩ/m. This value of resistance is advantageous since no excessive current is induced in the sensing wire by the magnetic field of the coils of the MR system and the risk for damaging the MR system or harming the patient is reduced.

To easily locate the error in the supply or signal line it is advantageous to couple several different sensing wires to the supply or signal line. Alternatively, a network of highly resistive sensing wires may be coupled to the supply or signal line. Furthermore, additional resistors can be connected to the highly resistive sensing wire or to the network of highly resistive sensing wires, to further add additional impedance. This increases the difference in the measured impedances for different locations of the error in the supply or signal line and simplifies the determination of the location of the error. The highly resistive sensing wires may, for example, be made of materials, preferably alloys, having a low conductivity, or may be made of a very thin conducting material, e.g. a thin metal surface as conducting material covering a nonconductive material and/or filament.

According to one embodiment of the invention, the method for locating an error in a supply or signal line of a magnetic resonance system further comprises the step of coupling an additional impedance to the supply or signal line in a region of interconnection. In order to distinguish between an error allocated in one subunit and an error allocated in an adjacent subunit, it is advantageous to couple several additional impedances to the supply or signal line. Preferably, at least one additional impedance is coupled to the supply or signal line in each subunit of the supply or signal line or in each region of interconnection. More preferably, two additional impedances are coupled to the supply or signal line in each subunit of the supply or signal line.

According to one embodiment of the invention, the step of measuring an impedance comprises measuring an impedance of the supply or signal line. Preferably the measurement of the impedance is integrated in the power supply of the MR system. More preferably the step of measuring an impedance of the supply or signal line comprises the step of connecting the supply or signal line to the power supply, and measuring the voltage and current of the supply or signal line as a function of time. Furthermore, the impedance may be measured by continuously using a sine signal on top of the supply voltage, by sequentially using small jumps of the supply voltage and measuring the temporal response, and/or by sequentially using frequency sweeps and measuring the spectral response.

According to one embodiment of the invention, the step of measuring an impedance comprises measuring an impedance between a highly resistive sensing wire and the supply or signal line. For example, the voltage may be sensed via the highly resistive sensing wire and the supply or signal line, ensuring that the input impedance of the impedance measurement device is sufficiently high. Alternatively the resistance between the highly resistive sensing wire and the supply or signal line may be measured. If there is an error in the supply or signal line, allocated in one of the subunits, different impedances are measured for the different error allocations. Thus, the location of the error in the supply or signal line can be determined.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
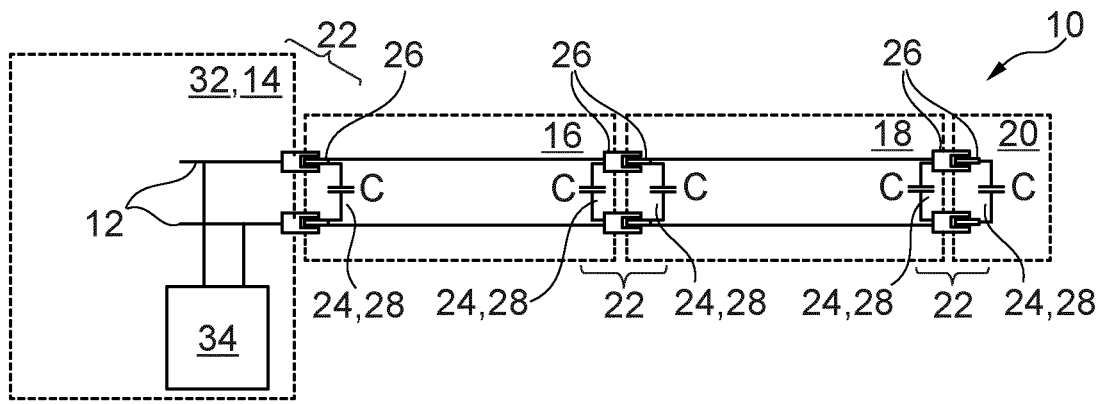
FIG. 1 schematically depicts one possible embodiment of a magnetic resonance system comprising a supply line, wherein the additional impedance is provided as capacitor.

FIG. 1 depicts one possible embodiment of the magnetic resonance (MR) system 10 as disclosed herein. The MR system 10 comprises a supply line 12 (sometimes referred to herein as signal line 12 (see FIG. 3), used for transmitting power to coil electronics 20 inside the coil that provide the MR specific functions such as signal amplification, coil detuning, A/D conversion, signal processing, and digital transmission. The supply line 12 consist of several subunits 14, 16, 18, 20. In this embodiment, the subunits are a power supply 14, a coil connector cable 16, a coil cable 18, and coil electronics 20.

The subunits 14, 16, 18, 20 are interconnected, i.e. the power supply 14 is connected to the coil connector cable 16, the coil connector cable 16 is connected to the coil cable 18, and the coil cable 18 is connected to the coil electronics 20. In the regions of interconnection region 22 of two subunits, i.e. in the interconnection region 22 where the power supply 14 is connected to the coil connector cable 16, in the interconnection region 22 where the coil connector cable 16 is connected to the coil cable 18, and in the interconnection region 22 where the coil cable 18 is connected to the coil electronics 20, additional impedances 24 are coupled to the supply line 12.

In the embodiment depicted in FIG. 1, the additional impedances 24 are realized as additional capacitance and are provided as capacitors 28. The capacitors 28 are connected to the supply line 12 in parallel in the regions of interconnection region 22. In this embodiment the subunits 14, 16, 18, 20 comprise connectors 26 for interconnecting the subunits 14, 16, 18, 20 with each other. The capacitors 24 are integrated in the connectors 26. The capacitors 28 each have a capacitance in the order of 100 pF to 1 nF; a capacitance small enough not to disturb the functions of the supply line 12 and MR system 10 and a capacitance high enough for a reliable location of the error.

Furthermore, the MR system 10 comprises an impedance measurement device 34 that is integrated in the power supply 14. For example, the impedance measurement device can be an LCR meter (Inductance (L), Capacitance (C), and Resistance (R)). An LCR meter can measure the inductance, resistance and capacitance of a component and from these values, the impedance at any frequency can be determined. For example, for measuring the impedance of the supply line 12 the voltage and current of the supply line 12 as a function of time can be measured. By measuring the impedance of the supply line 12 the location of the error in the supply line 12 can be determined. For the MR system 10 depicted in FIG. 1 the relation between the location of the error in the supply line 12 and the measured capacitance is for example as follows, assuming ideal (lossless) components:

| Measured capacitance | Location of error | Possible service action |
| --- | --- | --- |
| 5 C + residual cable capacitance | No error in supply chain 12 | In case of errors replace power supply 14 or coil electronics 20 |
| 4 C + residual cable capacitance | No connection between coil electronics 20 and coil cable 18 | Check connector 26 for obvious issues between subunit 20 and subunit 18, replace coil electronics 20 |
| 3 C + residual cable capacitance | Error in coil cable 18 | Replace coil cable 18 |
| 2 C | No connection between coil cable 18 an coil connector cable 16 | Check connector 26 for obvious issues between subunit 18 and subunit 16 |
| 1 C | Error in coil connector cable 16 | Replace coil connector cable 16 |

| Measured capacitance | Location of error | Possible service action |
|---|---|---|
| No C | No connection between power supply 14 and the coil connector cable 16 | Check connector 26 for obvious issues between subunit 16 and subunit 14, replace coil connector cable 16 |

Figure 2:
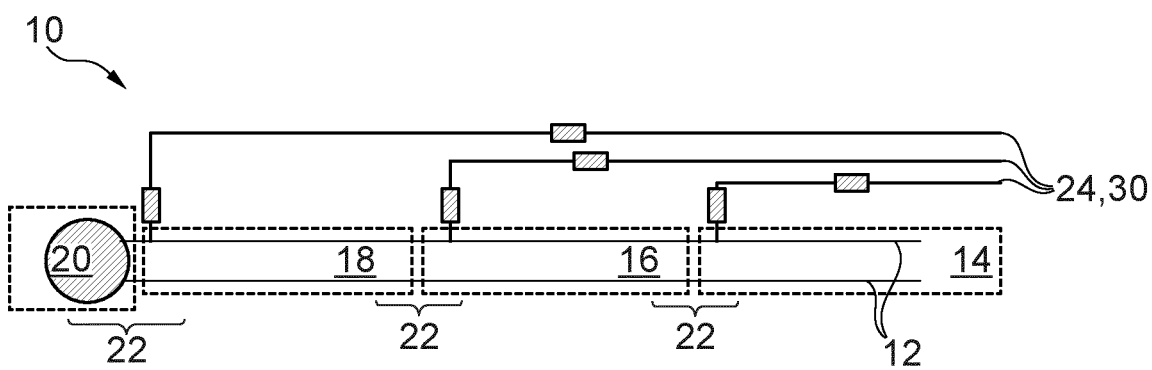
FIG. 2 schematically depicts another possible embodiment of a magnetic resonance system comprising a supply line, wherein the additional impedance is provided as a highly resistive sensing wire.

FIG. 2 depicts another possible embodiment of the MR system 10 as disclosed herein. The MR system 10 comprises a supply line 12, used for transmitting power to coil electronics 20 inside the coil that provide the MR specific functions such as signal amplification, coil detuning, A/D conversion, signal processing, and digital transmission. The supply line 12 consist of several subunits 14, 16, 18, 20, in this embodiment, the subunits are the power supply 14, the coil connector cable 16, the coil cable 18, and the coil electronics 20.

The subunits 14, 16, 18, 20 are interconnected, i.e. the power supply 14 is connected to the coil connector cable 16, the coil connector cable 16 is connected to the coil cable 18, and the coil cable 18 is connected to the coil electronics 20. In the regions of interconnection region 22 of two subunits, i.e. in the interconnection region 22 where the power supply 14 is connected to the coil connector cable 16, in the interconnection region 22 where the coil connector cable 16 is connected to the coil cable 18, and in the interconnection region 22 where the coil cable 18 is connected to the coil electronics 20, additional impedances 24 are coupled to the supply line 12.

In the embodiment depicted in FIG. 2, the additional impedance 24 is realized as additional resistance and is provided as highly resistive sensing wire 30. In this embodiment one highly resistive sensing wire 30 is coupled to each region of interconnection region 22, hence three highly resistive sensing wires 30 are used for locating the error in the supply line 12. The highly resistive sensing wires 30 are coupled to one path of the supply line 12. However, it is possible that each path of the supply line 12 is equipped with highly resistive sensing wires 30. An error analysis of the MR system 10 may show that the likelihood for errors is different for one path of the supply line 12 to the other, especially when asymmetric supply lines 12 such as coaxial cables are used.

Furthermore, in the embodiment depicted in FIG. 2 additional resistors are connected in series to the highly resistive sensing wire 30, to further add additional impedance. This increases the difference in the measured impedances for different locations of the error in the supply line 12. The resistance of the highly resistive sensing wires 30 is preferably >1 kΩ/m for ensuring that no excessive currents are induced in the highly resistive sensing wire 30 by the magnetic field of the coils of the MR system 10. For determining the location of the error the impedance between the highly resistive sensing wire 30 and the supply line 12 can be measured. For example the voltage can be sensed via the highly resistive sensing wire 30 and the supply line 12, ensuring that the input impedance of the impedance measurement device is sufficiently high. If there is an error in the supply line 12, allocated in one of the subunits 14, 16, 18, 20 different impedances are measured for the different error allocations. Thus, the location of the error in the supply line 12 can be determined. Hence, no cumbersome additional tests have to be performed by exchanging one or the other subunit 14, 16, 18, 20 of the supply line 12 to see if the error persists or not.

Figure 3:
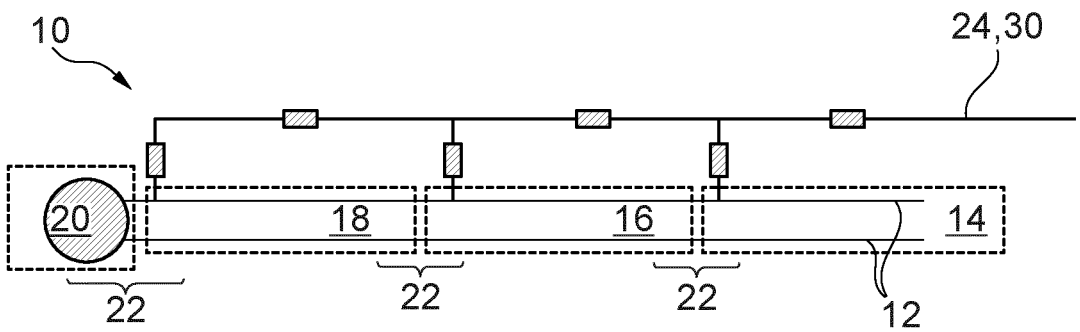
FIG. 3 schematically depicts another possible embodiment of a magnetic resonance system comprising a signal line, wherein the additional impedance is provided as a network of highly resistive sensing wires.

In a further embodiment, depicted in FIG. 3, the MR system 10 comprises a signal line 12, used for transmitting MR signals from the coil electronics 20 inside the coil. The signal line 12 consist of several subunits 14, 16, 18, 20, in this embodiment, the subunits are a first signal transmission line 14, a second signal transmission line 16 inside the patient table, a third signal transmission line 18, and the coil electronics 20. As well as in the embodiment depicted in FIG. 2, the subunits 14, 16, 18, 20 are interconnected. In the regions of interconnection region 22 of two subunits 14, 16, 18, 20 additional impedances 24 are coupled to the signal line 12.

In the embodiment depicted in FIG. 3, the additional impedance 24 is realized as additional resistance and is provided as a network of highly resistive sensing wires 30. In this embodiment the network of highly resistive sensing wire 30 is coupled to each region of interconnection region 22 for locating the error in the signal line 12. The network of highly resistive sensing wires 30 is coupled to one path of the signal line 12 and additional resistors are connected to the network of highly resistive sensing wire 30 to further add additional impedance. This increases the difference in the measured impedances for different locations of the error in the signal line. For determining the location of the error the impedance between the highly resistive sensing wire 30 and the signal line 12 can be measured.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST

Magnetic resonance system 10
Supply or signal line 12
Subunit, power supply, first signal transmission line 14
Subunit, coil connector cable, second signal transmission line 16
Subunit, coil cable, third signal transmission line 18
Subunit, coil electronics 20
Interconnection Region 22
Additional impedance 24
Connector 26
Capacitor 28
Resistor, highly resistive sensing wire 30
Power supply 32
Impedance measurement device

The invention claimed is:

1. A magnetic resonance (MR) system comprising:
a supply or signal line, comprising a power supply subunit, an MR coil subunit, and at least one cable subunit configured to electrically interconnect the MR coil subunit to the power supply subunit, wherein the at least one cable subunit comprises a pair of conductors having a first end and a second end, the pair of conductors connectable at the first end to respective conductors of the power supply subunit in a first interconnection region, and the pair of conductors connectable at the second end to respective conductors of the MR coil subunit in a second interconnection region, wherein the supply or signal line defines a characteristic impedance;

at least one additional impedance disposed in the first interconnection region and coupled to one of the conductors in the first interconnection region, and at least one additional impedance disposed in the second interconnection region and coupled to one of the conductors in the second interconnection region, each of the additional impedances providing a defined reference impedance value;

wherein the power supply subunit comprises an impedance measurement device having an input coupled to at least one of the conductors of the power supply subunit and configured to measure an impedance in the supply or signal line, wherein a value of the measured impedance is a first predetermined impedance value when a connection error is not present in the supply or signal line, and wherein a value of the measured impedance is a second predetermined impedance value different from the first predetermined impedance value when a connection error is present in the supply or signal line, wherein the second predetermined impedance value is dependent on and indicative of a location of a connection error in the supply or signal line.

2. The MR system according to claim 1, wherein in each of the first and second interconnection regions, the respective subunits each comprise an electrical connector, with the at least one additional impedance integrated in at least one of the electrical connectors.

3. The MR system according to claim 1, wherein the respective additional impedances each comprise a capacitor, a resistor, an inductor and/or a resonant circuit.

4. The MR system according to claim 1, wherein in each of the first and second interconnection regions, each at least one additional impedance is connected in parallel with the conductors of a respective one of the subunits.

5. The MR system according to claim 1, wherein in each of the first and second interconnection regions, each at least one additional impedance is connected in series with one of the conductors of a respective one of the subunits.

6. The MR system according to claim 1, wherein in each of the first and second interconnection regions, each at least one additional impedance comprises a resistive sensing wire coupled to one of the conductors of a respective one of the subunits or a network of highly resistive sensing wires coupled to one of the conductors of a respective one of the subunits, wherein each of the highly resistive sensing wires has a resistance of at least 1 k$\Omega$/m.

7. A method for locating an error in a supply or signal line of a magnetic resonance (MR) system comprising a supply or signal line and additional impedances coupled to the supply or signal line, wherein the supply or signal line comprises a power supply subunit, an MR coil subunit, and at least one cable subunit configured to electrically interconnect the MR coil subunit to the power supply subunit, wherein the at least one cable subunit comprises a pair of conductors having a first end and a second end, the pair of conductors connectable at the first end to respective conductors of the power supply subunit in a first interconnection region, and the pair of conductors connectable at the second end to respective conductors of the MR coil subunit in a second interconnection region, wherein the supply or signal line defines a characteristic impedance, wherein the additional impedances comprise at least one additional impedance disposed in the first interconnection region and coupled to one of the conductors in the first interconnection region, and at least one additional impedance disposed in the second interconnection region and coupled to one of the conductors in the second interconnection region, each of the additional impedances providing a defined reference impedance value, the method comprising:

a) measuring an impedance in the supply or signal line using an impedance measurement device of the power supply subunit having an input coupled to at least one of the conductors of the power supply subunit, b) comparing the measured impedance to one or more of a plurality of predetermined impedance values, the plurality of predetermined impedance values comprising a first predetermined impedance value corresponding to an absence of connection errors in the supply or signal line and at least one second predetermined impedance value corresponding to a connection error present in the supply or signal line, wherein each second predetermined impedance value is different than the first predetermined impedance value and dependent on and indicative of a location of a respective connection error in the supply or signal line, and c) determining whether a connection error is present at a location in the supply or signal line based on the comparing.

8. The method according to claim 7, wherein each additional impedance comprises a sensing wire having a first end coupled to one of the conductors in a respective one of the first and second interconnection regions, and wherein measuring an impedance in the supply or signal line using the impedance measurement device comprises measuring an impedance between a second end of each sensing wire and one of the conductors of the power supply subunit that is to be coupled to the first end of the sensing wire via one or more of the first and second interconnection regions.

9. The method according to claim 7, wherein in each of the first and second interconnection regions, the respective subunits each comprise an electrical connector, with the at least one additional impedance integrated in at least one of the electrical connectors.

10. The method according to claim 7, wherein the respective additional impedances each comprise a capacitor, a resistor, an inductor and/or a resonant circuit.

11. The method according to claim 7, wherein the method further comprises, in each of the first and second interconnection regions, connecting each at least one additional impedance in parallel with the conductors of a respective one of the subunits.

12. The method according to claim 7, wherein the method further comprises, in each of the first and second interconnection regions, connecting each at least one additional impedance in series with one of the conductors of a respective one of the subunits.

13. The method according to claim 7, wherein in each of the first and second interconnection regions, each at least one additional impedance comprises a resistive sensing wire coupled to one of the conductors of a respective one of the subunits or a network of highly resistive sensing wires coupled to one of the conductors of a respective one of the subunits, wherein each of the highly resistive sensing wire has a resistance of at least 1 kΩ/m, or wherein the network of highly resistive sensing wires has a resistance of at least 1 kΩ/m.

* * * * *